(12) United States Patent
Kim et al.

(10) Patent No.: US 10,330,710 B2
(45) Date of Patent: Jun. 25, 2019

(54) APPARATUS FOR MANAGING POWER OF VEHICLE AND METHOD OF CONTROLLING THE SAME

(71) Applicants: HYUNDAI MOTOR COMPANY, Seoul (KR); KIA MOTORS CORPORATION, Seoul (KR)

(72) Inventors: Woo Kuen Kim, Seoul (KR); Jin Gu Kwon, Seoul (KR); Myoung Soo Park, Bucheon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 15/833,374

(22) Filed: Dec. 6, 2017

(65) Prior Publication Data

US 2018/0364284 A1    Dec. 20, 2018

(30) Foreign Application Priority Data

Jun. 20, 2017  (KR) .................... 10-2017-0077880

(51) Int. Cl.
   *G01R 19/165*  (2006.01)
   *B60R 16/033*  (2006.01)

(52) U.S. Cl.
   CPC ...... *G01R 19/16542* (2013.01); *B60R 16/033* (2013.01)

(58) Field of Classification Search
   CPC combination set(s) only.
   See application file for complete search history.

(56) References Cited

U.S. PATENT DOCUMENTS

| | | | |
|---|---|---|---|
| 8,823,563 B1 | 9/2014 | Ransun | |
| 2009/0167575 A1* | 7/2009 | Mitani | H03M 1/1038 341/118 |
| 2018/0188326 A1* | 7/2018 | Huh | G01R 19/16504 |

FOREIGN PATENT DOCUMENTS

| | | |
|---|---|---|
| JP | 2007080972 A | 7/2007 |
| KR | 10-1457923 | 10/2014 |
| KR | 10-2015-0047280 | 5/2015 |
| KR | 10-1527136 B | 6/2015 |

* cited by examiner

*Primary Examiner* — Thomas G Black
*Assistant Examiner* — Ana D Thomas
(74) *Attorney, Agent, or Firm* — Brinks Gilson & Lione (57) ABSTRACT

The present disclosure provides a power management apparatus of a vehicle and a method of controlling the same, for determining whether a power circuit of a vehicle controller is abnormal. The power management apparatus includes a battery, a battery sensor configured to acquire voltage information of the battery, and a controller configured to receive the voltage information of the battery, to compare a second voltage and a third voltage with preset reference information, and to determine whether power is abnormal, wherein a first voltage is measured by the controller, the second voltage is adjusted by converting the first voltage into a digital signal, and the third voltage is measured by the battery sensor.

15 Claims, 8 Drawing Sheets

| REFERENCE INFORMATION ||
|---|---|
| SECOND REFERENCE VOLATGE | THIRD REFERENCE VOLTAGE |
| 531 | 13.6V |
| 535 | 13.7V |
| 539 | 13.8V |
| 543 | 13.9V |
| 547 | 14.0V |
| 551 | 14.1V |
| 555 | 14.2V |

APPARATUS FOR MANAGING POWER OF VEHICLE AND METHOD OF CONTROLLING THE SAME

CROSS-REFERENCE TO RELATED APPLICATION

The present application claims priority to and the benefit of Korean Patent Application No. 10-2017-0077880, filed on Jun. 20, 2017, which is incorporated herein by reference in its entirety.

FIELD

The present disclosure relates to a power management apparatus and a method of controlling the same, for determining whether a power system of a vehicle is abnormal.

BACKGROUND

The statements in this section merely provide background information related to the present disclosure and may not constitute prior art.

In general, a fuse box is installed in a vehicle. The fuse box normally contains a fuse to protect a circuit from power supplied to various electronic devices. Recently, a smart junction box (SJB) is prevalent as a multifunctional fuse box which contains a microcontroller unit (MCU) controlling an operational time of various relay circuits and other electronic devices, besides a general purpose of the fuse box.

Figure 1:
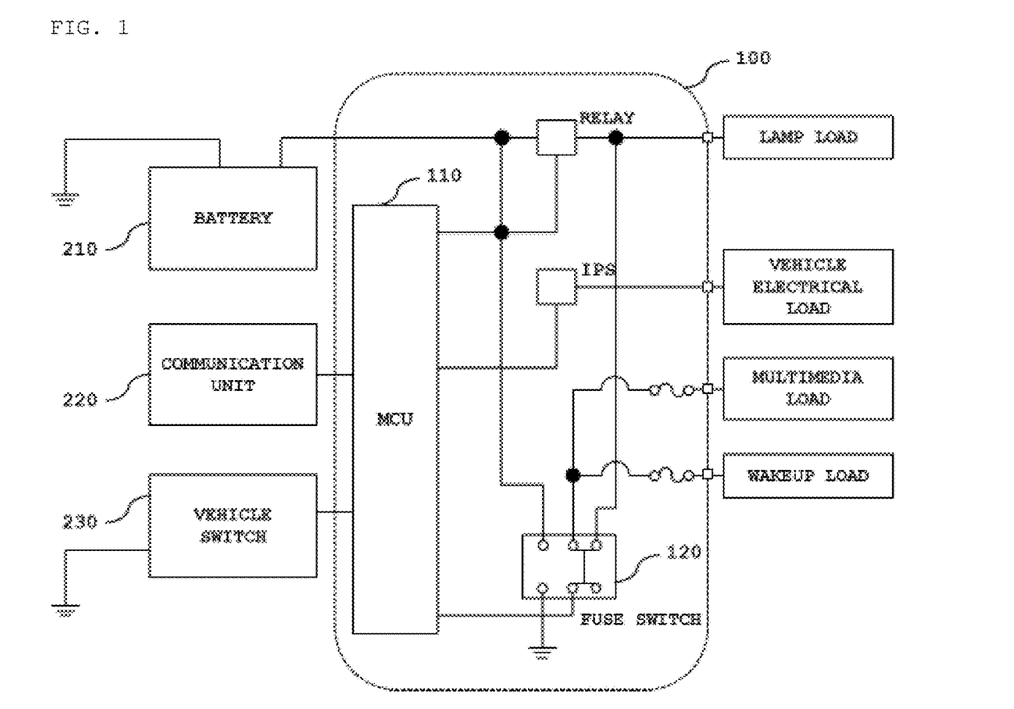
FIG. 1 is a diagram illustrating an example of a general smart junction box.

FIG. 1 is a diagram illustrating an example of a general smart junction box 100.

Referring to FIG. 1, the smart junction box 100 may include an MCU 110 which controls in supplying or shutting off power to various loads in a vehicle. It triggers a relay and an intelligent power switch (IPS) with power supplied from a battery 210 based on a control signal received through a communication unit 220 and a state of a vehicle switch 230. In addition, the smart junction box 100 may normally include a fuse switch 120 that is turned on when a vehicle is delivered to a customer. As a result, the MCU 110 may control power supplied to the vehicle using different methods according to a state of the fuse switch 120, which will be described with reference to FIG. 2.

Figure 2:
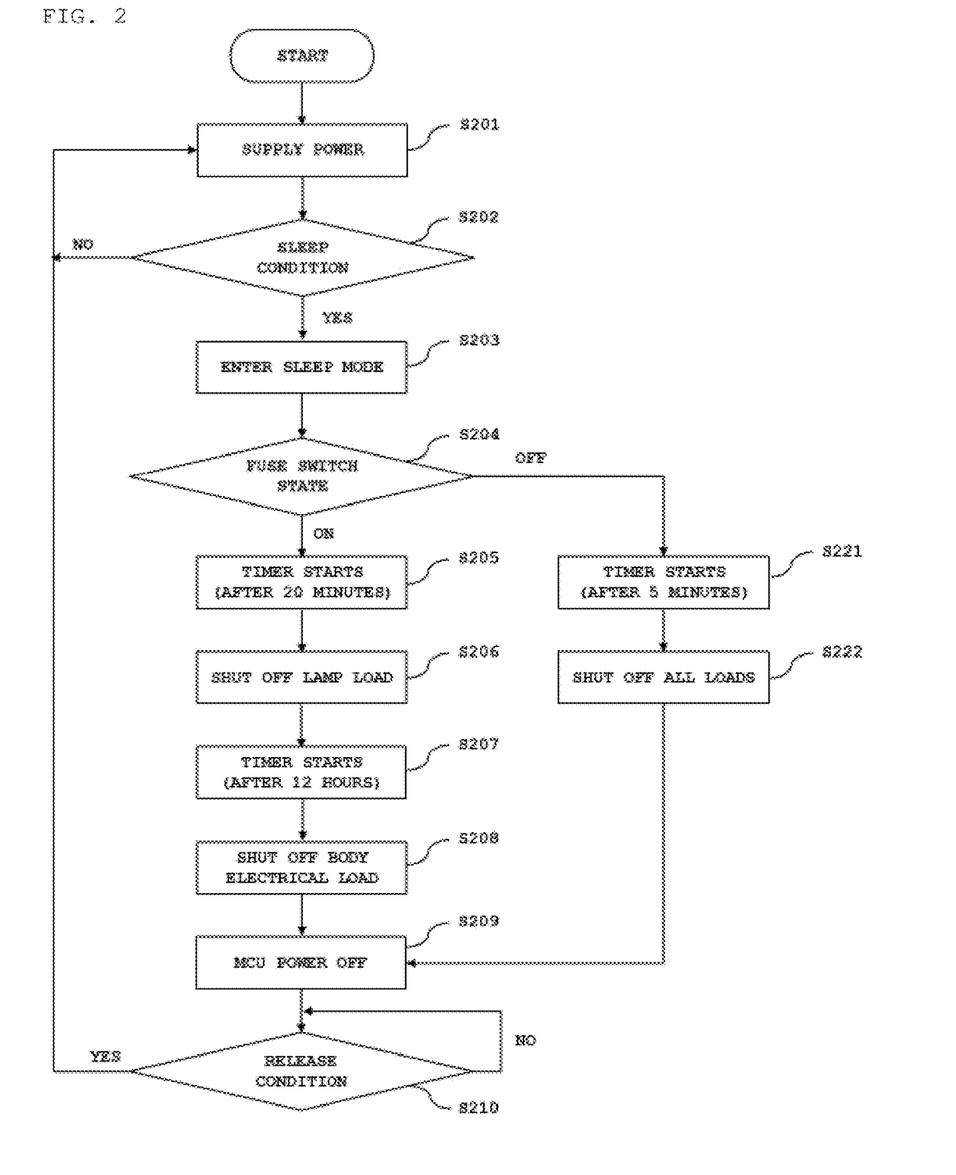
FIG. 2 is a flowchart illustrating an example of a procedure of managing vehicle power in a general smart junction box.

FIG. 2 is a flowchart illustrating an example of a procedure of managing vehicle power in a general smart junction box.

Referring to FIG. 2, as external switch input is generated or controller area network (CAN) communication is activated, the smart junction box may supply power to various load systems in a vehicle (S201). When a sleep mode condition is satisfied (e.g., CAN communication enters a sleep mode) after power is supplied (S202), the smart junction box may enter a sleep mode (S203) and perform an operation for shutting off dark current.

The operation for shutting off dark current may be varied according to a fuse switch state (S204). In detail, when the fuse switch is turned on at time of delivery to a customer, if a timer is started and a predetermined time (e.g., 20 minutes) elapses (S205), a lamp load is first shut off (S206). However, when a longer time (e.g., 12 hours) elapses (S207), a body electrical load may be shut off (S208). When the body electrical load is shut off, the MCU is powered off (S209) and is maintained in a corresponding state until a preset release condition is satisfied (S210). Here, when a lock signal is received through a remote controller such as a smart key after the timer is started, a short time (e.g., 5 seconds) elapses and, then, a load may be shut off. In addition, the preset release condition may be such as a change in exchange switch input and/or CAN communication activation.

When a fuse switch state is off, if a predetermined time (e.g., 5 minutes) elapses after the timer is started (S211), all loads may be shut off at one time (S222).

However, in the aforementioned power management apparatus, only some loads (i.e., lamp load and body load) are structurally shut off by a smart junction box. Also, a dark current blocking function is activated only per management policies of a vehicle manufacturer. As a result, it may be difficult to satisfy driver requirements.

In addition, determining whether a power system of a driving vehicle is abnormal is conducted for each load and, thus, the number of resistors required by a circuit for detecting and monitoring abnormal power may increase, thereby increasing manufacturing costs as well.

SUMMARY

The present disclosure provides a power management apparatus of a vehicle and a method of controlling the same, for determining whether a power system of a vehicle is abnormal.

In particular, the present disclosure provides a power management apparatus of a vehicle and a method of controlling the same which may contribute in enhancing product reliability and reducing manufacturing costs. This can be achieved by a resistor circuit and error correction logic that is designed to collectively monitor a battery voltage supplied to a plurality of loads.

In one form of the present disclosure, a power management apparatus of a vehicle includes a battery, a battery sensor configured to acquire voltage information of the battery, and a controller configured to receive the voltage information of the battery, to compare a second voltage and a third voltage with preset reference information, and to determine whether power is abnormal, wherein a first voltage is measured by the controller, the second voltage is adjusted by converting the first voltage into a digital signal, and the third voltage is measured by the battery sensor.

In another form of the present disclosure, a method of controlling a power management apparatus for a vehicle includes calculating a second voltage that is adjusted by converting a first voltage into a digital signal, wherein the first voltage is measured by a controller and the controller includes a monitoring circuit and a microcontroller unit (MCU), measuring a third voltage from a battery sensor, comparing the second voltage and the third voltage with preset reference information, and determining whether power is abnormal.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Here, the suffixes "module" and "unit" of elements herein are used for convenience of description and thus can be used interchangeably and do not have any distinguishable meanings or functions.

In the following description of the at least one form, a detailed description of known functions and configurations incorporated herein will be omitted for the purpose of clarity and for brevity. The features of the present disclosure will be more clearly understood from the accompanying drawings and should not be limited by the accompanying drawings, and all changes, equivalents, and substitutes that do not depart from the spirit and technical scope of the present disclosure are encompassed in the present disclosure.

To determine whether a power system is abnormal and to warn a user during driving, a form of the present disclosure proposes a resistor circuit and error correction logic for collectively monitoring a battery voltage applied to a plurality of loads.

A power management system 300 of a vehicle for the above proposal will be described with reference to FIG. 3.

Figure 3:
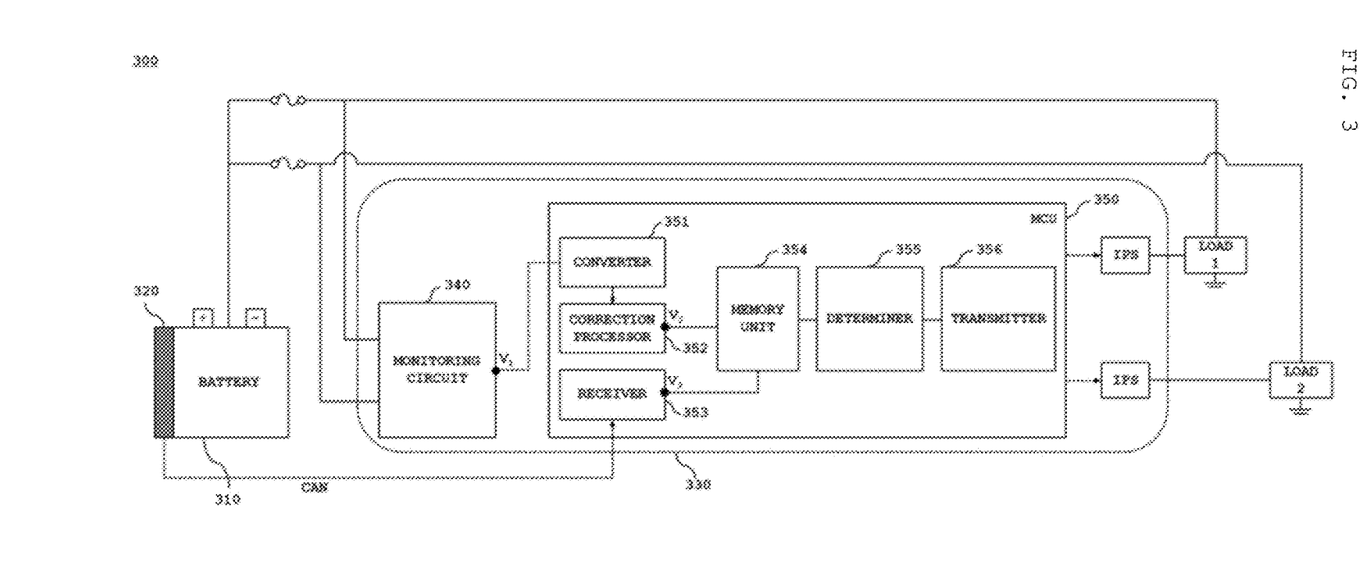
FIG. 3 is a diagram illustrating configuration of a power management system.

FIG. 3 is a diagram illustrating configuration of the power management system 300 in some forms of the present disclosure.

Referring to FIG. 3, the power management system 300 in some forms of the present disclosure may include a battery 310, a battery sensor 320, and a controller 330.

The battery 310 may supply power to various load systems in the vehicle and the battery sensor 320 installed in the battery 310 may detect power supplied by the battery 310.

The controller 330 may receive battery voltage information detected by the battery sensor 320 through a network in the vehicle.

In some forms of the present disclosure, a communication method for embodying a network system may be wired communication applicable to vehicles, for example, controller area network (CAN), local interconnect network (LIN), Flexray, Ethernet, and so on, but is not limited thereto.

The controller 330 may be an integrated control unit (ICU) or may be embodied as an integrated gateway & power control module (IGPM) but is not limited thereto.

The controller 330 may include a monitoring circuit 340 and a microcontroller unit (MCU) 350.

The monitoring circuit 340 may drop a voltage applied from the battery 310 and output the dropped voltage to the MCU 350, and the MCU 350 may convert a voltage applied from the monitoring circuit 340 into a digital signal and compare a voltage with a correction constant applied thereto with reference information to determine whether a power system is abnormal.

Here, the correction constant may be defined as a value calculated in consideration of an error rate of a plurality of resistors included in the monitoring circuit 340, which will be described below with reference to FIGS. 5A and 5B.

The reference information may be configured in the form of a table including a plurality of items defined as preset data, which will be described below with reference to FIG. 6.

The MCU 350 may include a converter 351, a correction processor 352, a receiver 353, a memory unit 354, a determiner 355, and a transmitter 356.

The converter 351 may include an analog/digital converter (ADC) for converting a voltage (hereinafter, referred to as a "first voltage") output from the monitoring circuit 340 into a digital signal.

The correction processor 352 may apply the correction constant to a voltage obtained by converting the first voltage into a digital signal to calculate a voltage (hereinafter, referred to as a "second voltage") with high reliability.

The receiver 353 may receive a battery voltage (hereinafter, referred to as a "third voltage") detected by the battery sensor 320 through a network.

The memory unit 354 may generate preset reference information and a memory space for storing the reference information, and an applicable apparatus may include an electrically erasable programmable read-only memory (EEPROM) or the like but is not limited thereto.

The determiner 355 may compare the second voltage corresponding to the third voltage with reference information to determine whether a power system including components to the controller 330 from the battery 310 is abnormal and the transmitter 356 may transmit a warning message to a display device in the vehicle upon determining that the power system is abnormal.

The controller 330 may include an intelligent power switch (IPS) that is operated to supply or shut off power supplied from the battery 310 to various loads in the vehicle.

Load 1 and load 2 may include a headlamp load, a vehicle electrical load, a multimedia load, or the like but this is purely exemplary and the present disclosure is not limited thereto.

Figure 4A:
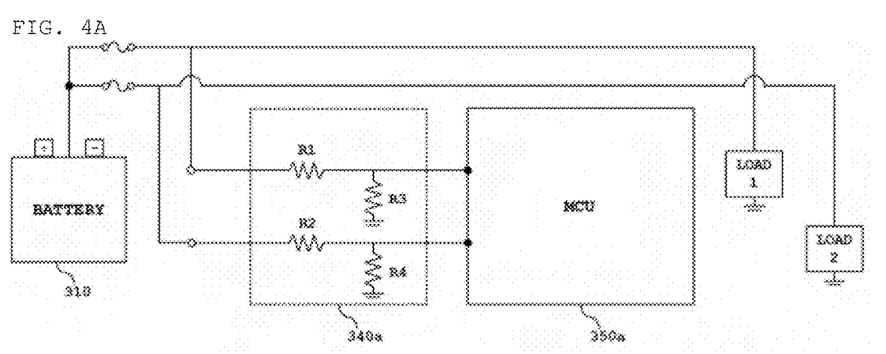
FIGS. 4A and 4B are diagrams illustrating an example of monitoring circuits.
Figure 4B:
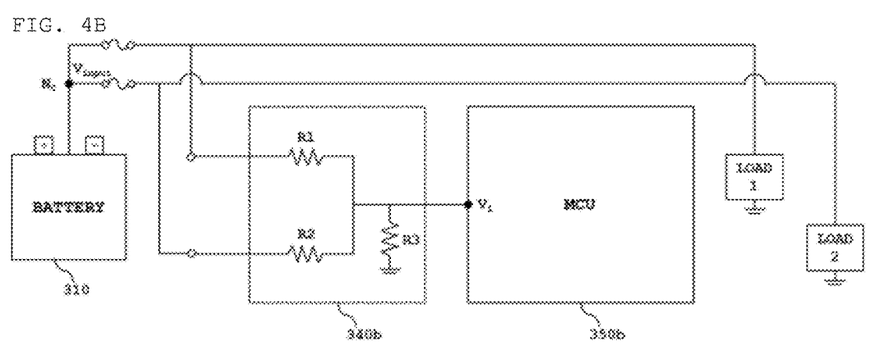

Hereinafter, configuration of monitoring circuits 340a and 340b will be described in more detail based on the aforementioned power management system 300.

FIGS. 4A and 4B are diagrams illustrating an example of monitoring circuits 340a and 340b in some forms of the present disclosure.

The monitoring circuits 340a and 340b may drop a voltage applied from the battery 310 and output the dropped voltage to MCUs 350a and 350b, and the MCUs 350a and 350b may monitor the voltage output from the monitoring circuits 340a and 340b to determine whether a power system including components to the controller from the battery 310 is abnormal.

First, referring to FIG. 4A, the monitoring circuit 340a in some forms of the present disclosure may independently include a plurality of resistors R1 and R3 that are connected in series to load 1 among a plurality of loads and a plurality of resistors R2 and R4 that are connected in series to load 2.

Referring to FIG. 4B, the monitoring circuit 340b in some forms of the present disclosure may include a plurality of resistors R1 and R2 that are connected in parallel to a plurality of loads and a common node Nc of a battery, and a resistor R3 connected in series to a plurality of resistors that are connected in parallel.

When the monitoring circuit 340b is used, the MCU 350b measure one voltage $V_1$ output by the monitoring circuit 340b to determine whether power is abnormal and, thus, a battery voltage supplied to a plurality of loads is collectively monitored and some of a plurality of resistors included in a circuit are omitted, thereby reducing manufacturing costs.

A plurality of resistors included in a monitoring circuit has an error rate and, thus, the correction constant may be applied to calculate a voltage with high reliability.

Hereinafter, a procedure of calculating a correction constant will be described in more detail.

In the following description including FIGS. 5A and 5B of the specification, for convenience of description, it is assumed that a controller of a vehicle is an integrated gateway & power control module (IGPM) of the controller. However, this is purely exemplary and the present disclosure is not limited thereto.

Figure 5A:
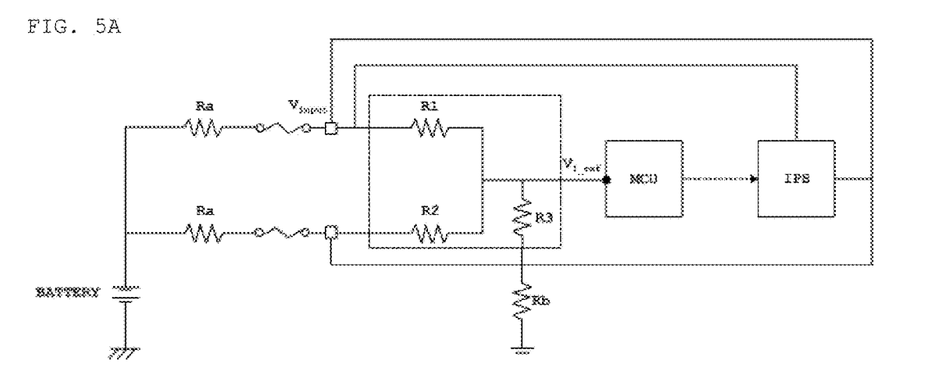
FIGS. 5A and 5B are diagrams illustrating an example of calculation of a correction constant and use of correction logic of a monitoring circuit.
Figure 5B:
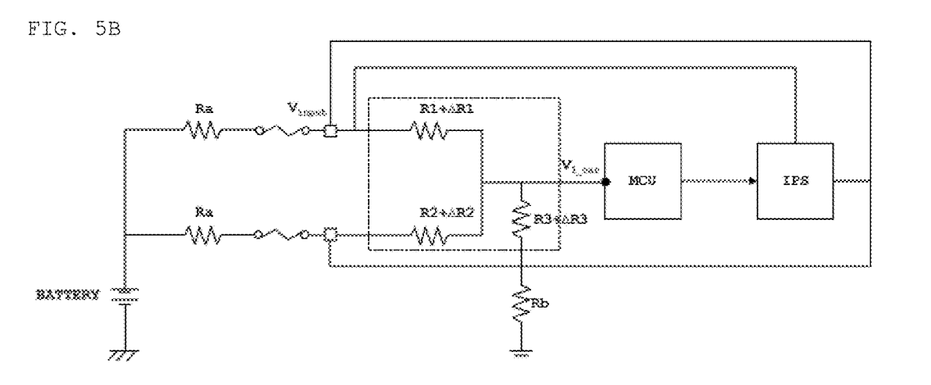

FIGS. 5A and 5B are diagrams illustrating an example of calculation of a correction constant and use of correction logic of a monitoring circuit.

In FIG. 5A, an IGPM sample with an ideal resistor without an error rate may be applied.

Referring to FIG. 5A, when a reference voltage $V_{input}$ with predetermined amplitude is applied to a monitoring circuit, a first voltage $V_{1\_ref}$ measured by the MCU may be calculated based on Ohm's law according to the following equation.

$$V_{1\_ref} = \left(\frac{R_3}{R_1 \| R_2 + R_3}\right) \times V_{input} = R \times V_{input} \quad \text{[Equation 1]}$$

In FIG. 5B, an IGPM sample with an actual resistor with an error rate may be applied.

Referring to FIG. 5B, when a reference voltage $V_{input}$ with predetermined amplitude is applied to a monitoring circuit, a first voltage $V_{1\_car}$ measured by an MCU may be calculated based on Ohm's law according to the following equation.

In this case, the monitoring circuit may include a plurality of resistors R1 and R2 that are connected in parallel to a plurality of loads and a common node of a battery, a resistor R3 connected in series to a plurality of resistors that are connected in parallel, and error resistors ΔR1, ΔR2 and ΔR3.

$$V_{1\_car} = \left(\frac{R_3 + \Delta R_3}{(R_1 + \Delta R_1)\|(R_2 + \Delta R_2) + R_3 + \Delta R_3}\right) \times V_{input} = \quad \text{[Expression 2]}$$
$$(R + \Delta R) \times V_{input}$$

A correction constant σ may be defined as the first voltage $V_{1\_ref}$ of the IGPM sample with an ideal resistor applied thereto with respect to the first voltage $V_{1\_car}$ of the IGPM sample with an actual resistor applied thereto based on the same voltage $V_{input}$ and may be calculated according to the following equation.

$$\sigma = \frac{R}{R + \Delta R} = \frac{\frac{V_{1\_ref}}{V_{input}}}{\frac{V_{1\_car}}{V_{input}}} = \frac{V_{1\_ref}}{V_{1\_car}} \approx \frac{V_{2\_ref}}{V_{2\_car}} \quad \text{[Equation 3]}$$

In this case, the correction constant σ may represent the same or different features for each produced IGPM and a memory unit of a controller may pre-store the calculated correction constant σ.

The correction constant σ calculated through the aforementioned procedure may be applied to the voltage $V_{2\_car}$ obtained by converting the first voltage measured in a condition of applying the IGPM with an actual resistor to a vehicle into a digital signal so as to reduce error and, thus, the second voltage $V_{2\_ref}$ with high reliability may be calculated.

The second voltage $V_{2\_ref}$ calculated via error correction logic may be calculated according to the following equation.

$$V_{2\_ref} = \sigma \times V_{2\_car} \quad \text{[Equation 4]}$$

The third voltage measured by the battery sensor 320 of the vehicle during driving may correspond to the second voltage calculated by applying a correction constant to a voltage obtained by converting a voltage measured by the controller 330 into a digital signal.

Hereinafter, a procedure of generating reference information as a comparison target to determine whether power is abnormal will be described in more detail.

Figure 6:
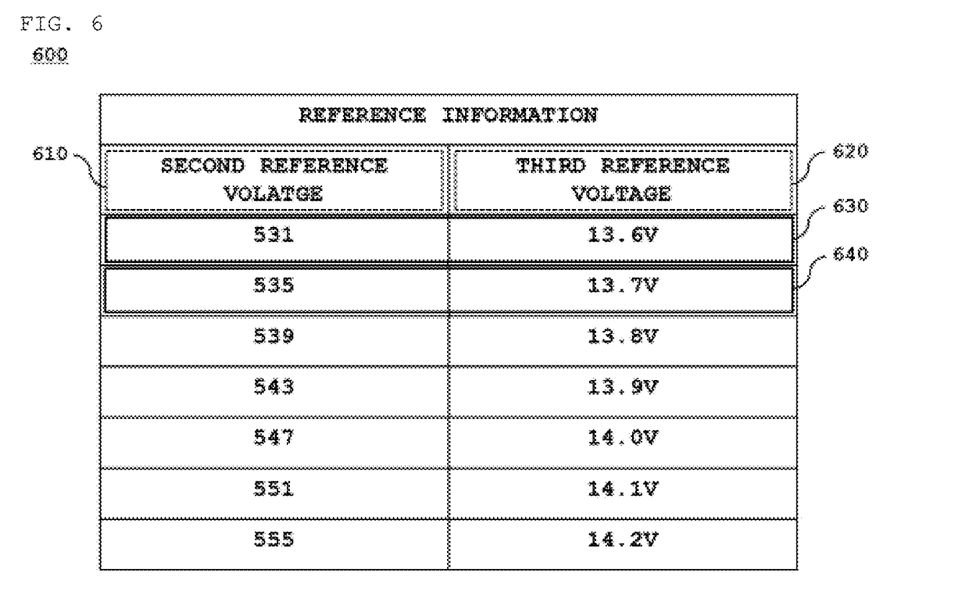
FIG. 6 is a diagram showing an example of preset reference information configured in the form of a table.

FIG. 6 is a diagram showing an example of preset reference information 600 configured in the form of a table.

The preset reference information 600 may be formed by configuring a second reference voltage 610 corrected by converting a first reference voltage measured by a controller into a digital signal and a third reference voltage 620 measured by a battery sensor, in the form of a table.

The second reference voltage may be a value obtained by converting the first reference voltage measured by an IGPM including an ideal resistor without an error rate into a digital signal. When the reference information is used, even if a resistor with a high error rate is used in the monitoring circuit 340, a voltage with high reliability may be provided, thereby enhancing product reliability and reducing manufacturing costs.

The third reference voltage measured by the battery sensor 320 may corresponds to the second reference voltage calculated by the controller 330.

In this case, the second reference voltage may be defined as a voltage converted into a digital signal by an analog/digital converter and may be stored in the form of an integer.

Battery voltage variation may be guided via various conditions after a vehicle is produced and, thus, the memory unit 354 of the controller 330 may generate a plurality of data of the second reference voltage and/or the third reference voltage.

The table may include a plurality of items 630 and 640, each of the plurality of items may include a pair of the second reference voltage and the third reference voltage that correspond to each other, and the pair of the second reference voltage and the third reference voltage, included in each of the plurality of items, may have different values.

For example, a first item 630 of the plurality of items may include a pair of a third reference voltage of 13.6 V and a second reference voltage of 531 V corresponding thereto and the second reference voltage and the third reference voltage, included in each of the first item 630 and a second item 640, may have different voltages. However, this is purely exemplary and it would be obvious to one of ordinary skill in the art that a detailed range of the second reference voltage and the third reference voltage is not limited thereto.

Hereinafter, logic for determining whether a power system is abnormal based on the aforementioned voltage measured by the battery sensor 320 during driving, the voltage calculated by the controller 330, and the preset reference information will be described with reference to FIGS. 7 and 8.

Figure 7:
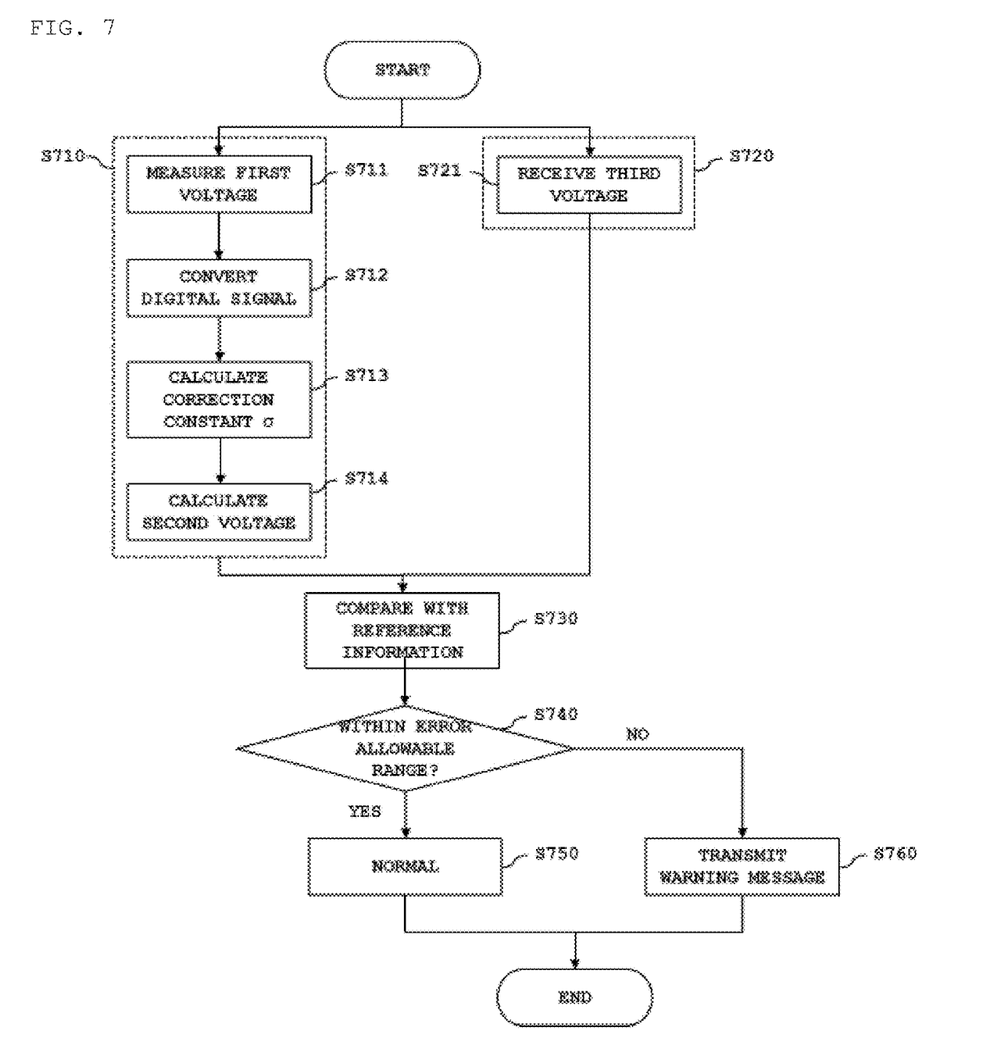
FIG. 7 is a diagram illustrating an example of the logic for determining whether a power system of a vehicle is abnormal during driving.

FIG. 7 is a diagram illustrating an example of the logic for determining whether a power system of a vehicle is abnormal during driving.

Referring to FIG. 7, first, the controller 330 may calculate a second voltage from the battery 310 of a driving vehicle (S710) and receive a third voltage from a battery sensor 320 (S720).

The converter 351 of the controller 330 may measure a first voltage output from the monitoring circuit 340 (S711) and an analog/digital converter (ADC) may convert the first voltage into a digital signal (S712).

The correction processor 352 may multiply the voltage converted into the digital by a preset correction constant (S713) to calculate the second voltage (S714).

The receiver 353 may receive a third voltage of a battery, detected by the battery sensor 320, through a network (S721).

Upon receiving voltage information of the driving vehicle via operations S710 and S720, the controller 330 may compare the voltage information with preset reference information (S730).

A procedure of comparing and determining real-time voltage information of a driving vehicle and preset reference information will be described in more detail with reference to FIG. 8.

Figure 8:
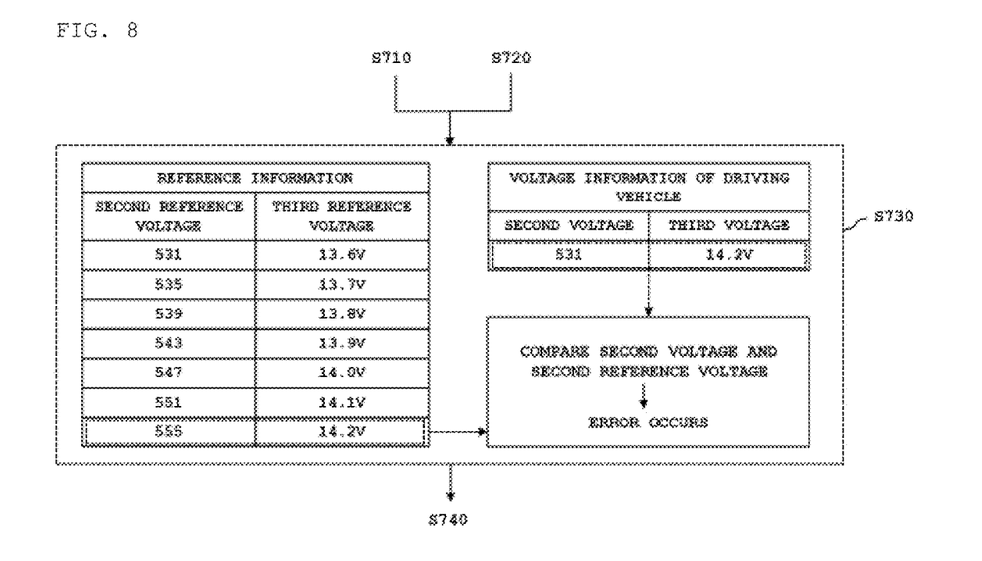
FIG. 8 is a diagram showing an example of comparison of the reference information and the real-time voltage information of a vehicle.

FIG. 8 is a diagram showing an example of comparison of the reference information and the real-time voltage information of a vehicle.

Referring to FIG. 8, a second reference voltage matched with a third reference voltage corresponding to a received third voltage may be compared with a second voltage to determine whether power is abnormal.

For example, when a third voltage of the real-time voltage information of a vehicle, received during driving, is 14.2 V, the second reference voltage corresponding to the third reference voltage corresponding to 14.2 V from the preset reference information may be retrieved and compared with the second voltage.

Referring back to FIG. 7, whether error between the second reference information and the reference information and the second voltage received by a driving vehicle is greater than a preset error allowable range may be determined (S740).

When the error is greater than the preset error allowable range, a warning message may be transmitted to a display device in the vehicle (S760).

The disclosure can also be embodied as computer readable code on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, carrier wave such as transmission via the Internet, etc.

In some forms of the present disclosure, the following effects may be obtained.

An issue that may arise due to abnormality of a power system of a vehicle may be pre-monitored and notified to a user, thereby reducing the number of accidents which may be caused during driving.

In addition, a resistor circuit and error correction logic for collectively monitoring a battery voltage applied to a plurality of loads may enhance product reliability and reduce manufacturing costs.

It will be appreciated by persons skilled in the art that that the effects that could be achieved with the present disclosure are not limited to what has been particularly described hereinabove and other advantages of the present disclosure will be more clearly understood from the detailed description taken in conjunction with the accompanying drawings.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A power management apparatus of a vehicle, the apparatus comprising:
   a battery;
   a battery sensor attached to the battery and configured to acquire voltage information of the battery; and
   a controller configured to:
   receive the voltage information of the battery;
   compare a second voltage and a third voltage with preset reference information; and
   determine whether power is abnormal,
   wherein a first voltage is measured by the controller, the second voltage is adjusted by converting the first voltage into a digital signal, and the third voltage is obtained from the voltage information directly received from the battery sensor.

2. The apparatus of claim 1, wherein the controller comprises an integrated control unit (ICU) and an integrated gateway & power control module (IGPM).

3. The apparatus of claim 1, wherein the preset reference information is configured in a form of a table based on a second reference voltage and a third reference voltage, wherein a first reference voltage is measured by the controller, the second reference voltage is adjusted by converting the first reference voltage into the digital signal, and the third reference voltage is measured by the battery sensor.

4. The apparatus of claim 3, wherein the table comprises:
   a plurality of items, wherein each of the plurality of items comprises a pair of a second reference voltage and a third reference, and wherein each pair of the second reference voltage and the third reference voltage have different values.

5. The apparatus of claim 1 wherein the controller comprises:
   a microcontroller unit (MCU); and
   a monitoring circuit configured to receive a voltage from the battery and to output the first voltage to the MCU, wherein the monitoring circuit comprises:
   at least one resistor connected in parallel to a common node between at least one load and the battery; and
   a resistor connected in series to the at least one resistor.

6. The apparatus of claim 5, wherein the MCU comprises:
a converter comprising an analog/digital converter that is configured to convert the first voltage into the digital signal;
a correction processor configured to calculate the second voltage by multiplying a value converted into the digital signal by a correction constant;
a memory unit configured to generate and store the preset reference information; and
a determiner configured to:
compare the second reference voltage with the second voltage; and
determine whether power is abnormal.

7. The apparatus of claim 6 further comprising:
a transmitter configured to transmit a warning message when error between the second reference voltage and the second voltage is greater than a preset allowable range.

8. The apparatus of claim 6, wherein the correction constant is calculated based on the at least one resistor connected in parallel to the common node between the at least one load and the battery, the resistor connected in series to the at least one resistor, and an error resistor in the monitoring circuit.

9. A method of controlling a power management apparatus of a vehicle, the method comprising:
calculating a second voltage that is adjusted by converting a first voltage into a digital signal, wherein the first voltage is measured by a controller and the controller comprises a monitoring circuit and a microcontroller unit (MCU);
receivinq directly a third voltage from a battery sensor attached to a battery;
comparing the second voltage and the third voltage with preset reference information; and
determining whether power is abnormal.

10. The method of claim 9, wherein the controller comprises an integrated control unit (ICU) and an integrated gateway & power control module (IGPM).

11. The method of claim 9 further comprising:
receiving a voltage from the battery; and
outputting the first voltage to the MCU,
wherein the monitoring circuit comprises:
at least one resistor connected in parallel to a common node between at least one load and the battery; and
a resistor connected in series to the at least one resistor.

12. The method of claim 11, wherein calculating the second voltage comprises:
calculating a correction constant based on the at least one resistor connected in parallel to the common node between the at least one load and the battery, the resistor connected in series to the at least one resistor, and an error resistor in the monitoring circuit; and
applying the correction constant to a value converted into the digital signal.

13. The method of claim 9, wherein the preset reference information is generated by:
calculating a second reference voltage that is adjusted by converting a first reference voltage into the digital signal, wherein the first reference voltage is measured by the controller;
measuring a third reference voltage from the battery sensor;
receiving the second reference voltage and the third reference voltage; and
configuring the second reference voltage and the third reference voltage in a form of a table.

14. The method of claim 13, wherein determining whether power is abnormal comprises:
comparing the second reference voltage with the second voltage; and
transmitting a warning message when error between the second reference voltage and the second voltage is greater than a preset allowable range.

15. A computer readable recording medium having a program recorded thereon, the program to direct a processor to perform acts of:
calculating a second voltage that is adjusted by converting a first voltage into a digital signal, wherein the first voltage is measured by a controller and the controller comprises a monitoring circuit and a microcontroller unit (MCU);
receiving directly a third voltage from a battery sensor attached to a battery;
comparing the second voltage and the third voltage with preset reference information; and
determining whether power is abnormal.

* * * * *